(12) United States Patent
Giduturi et al.

(10) Patent No.: US 7,176,751 B2
(45) Date of Patent: Feb. 13, 2007

(54) VOLTAGE REFERENCE APPARATUS, METHOD, AND SYSTEM

(75) Inventors: Hari Giduturi, Folsom, CA (US); Kerry D. Tedrow, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 139 days.

(21) Appl. No.: 11/000,317

(22) Filed: Nov. 30, 2004

(65) Prior Publication Data

US 2006/0114054 A1 Jun. 1, 2006

(51) Int. Cl.
*G05F 1/10* (2006.01)
(52) U.S. Cl. .................................................. 327/540
(58) Field of Classification Search ............... 323/312, 323/313, 314, 315, 316; 327/535, 537, 538, 327/539, 540, 541, 543
See application file for complete search history.

(56) References Cited

U.S. PATENT DOCUMENTS

| 5,339,272 | A | | 8/1994 | Tedrow et al. |
| 5,946,258 | A | * | 8/1999 | Evertt et al. ................. 365/226 |
| 6,396,739 | B2 | * | 5/2002 | Briner ....................... 365/185.2 |
| 6,559,710 | B2 | * | 5/2003 | Matsuoka .................... 327/537 |
| 6,798,278 | B2 | * | 9/2004 | Ueda ........................... 327/541 |
| 6,806,762 | B2 | * | 10/2004 | Stair et al. ................... 327/538 |
| 6,970,037 | B2 | * | 11/2005 | Sakhuja et al. ............. 327/566 |

* cited by examiner

*Primary Examiner*—Jeffrey S. Zweizig
(74) *Attorney, Agent, or Firm*—LeMoine Patent Services, PLLC

(57) ABSTRACT

A trimmable voltage reference uses a flash cell with a variable threshold voltage and a feedback loop to trim a reference voltage. The threshold voltage of the flash cell can be programmed to affect the reference voltage.

27 Claims, 8 Drawing Sheets

VOLTAGE REFERENCE APPARATUS, METHOD, AND SYSTEM

FIELD

The present invention relates generally to electronic circuits, and more specifically to trimmable voltage reference circuits.

BACKGROUND

Some voltage reference circuits generate an output voltage that is referenced to a value of a circuit element such as a resistor. Varying the output voltage may be performed by varying the value of the circuit element. A resistor may be placed on an integrated circuit die, but these types of resistors tend to be imprecise. A precision resistor may be placed outside an integrated circuit, but this may take up space.

DESCRIPTION OF EMBODIMENTS

Figure 1:
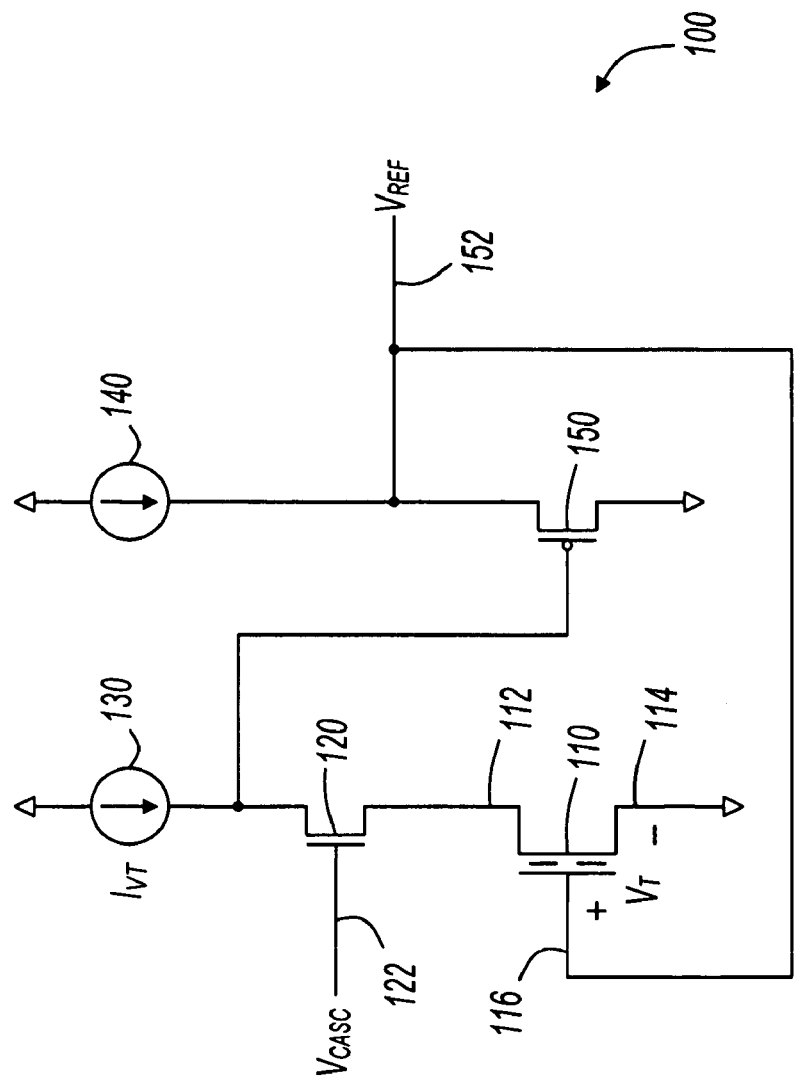
FIG. 1 shows a voltage reference circuit with a feedback loop.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 shows a voltage reference circuit with a feedback loop. Voltage reference circuit 100 includes flash cell 110, isolated gate transistors 120 and 150, and current sources 130 and 140. Flash cell 110, isolated gate transistor 120, and current source 130 form a first stage; and isolated gate transistor 150 and current source 140 form a second stage. The second stage is coupled to the first stage as part of a feedback loop in a unity gain configuration.

Transistors 120 and 150 are shown in FIG. 1 as isolated gate transistors, and specifically as metal oxide semiconductor field effect transistors (MOSFETs). Transistor 150 is shown as a P-type MOSFET, and transistor 120 is shown as an N-type MOSFET. Other types of circuit elements may be utilized for the various transistors of voltage reference circuit 100 without departing from the scope of the present invention. For example, the transistors of voltage reference circuit 100 may be junction field effect transistors (JFETs), bipolar junction transistors (BJTs), or any device capable of performing as described herein.

Flash cell 10 is an example of a floating gate transistor having a variable threshold voltage ($V_T$). The threshold voltage of flash cell 110 may be modified by changing the amount of charge stored on the floating gate of flash cell 110. This may also be referred to as "programming" flash cell 110. Flash cell 110 may be programmed with programming circuitry (not shown) useful for programming floating gate transistors.

As used herein, the term "threshold voltage current" refers to the current that flows through a transistor when a voltage of substantially $V_T$ appears across the control terminals of the transistor, and the drain voltage is set to a nominal value. For example, the threshold voltage current of an NMOS transistor is equal to the drain-to-source current of the transistor when the gate-to-source voltage is substantially $V_T$. Also for example, the threshold voltage current ($I_{VT}$) of flash cell 110 flows from drain 112 to source 114 when the gate-to-source voltage between nodes 116 and 114 is substantially $V_T$.

Isolated gate transistor 120 is coupled between current source 130 and flash cell 110 in a cascode configuration. The gate node of transistor 120 is coupled to node 122 which has a voltage of $V_{CASC}$. $V_{CASC}$ is a voltage that is chosen to provide a suitable drain voltage on drain node 112 of flash cell 110. For example, in some embodiments, $V_{CASC}$ is chosen to provide a drain voltage of between about 0.7 volts and 1.2 volts. In some embodiments, $V_{CASC}$ is set once and is static thereafter. For example, $V_{CASC}$ may be provided by an on-chip voltage reference that remains static. In other embodiments, $V_{CASC}$ may be provided by a variable voltage reference circuit, so that the drain voltage on flash cell 110 may be modified.

Transistor 150 is coupled as a "source follower," which provides low output impedance to drive relatively large capacitive loads easily. The gate node of transistor 150 is coupled to the drain node of transistor 120 to receive a voltage that is influenced by flash cell 110. The drain node of transistor 150 is coupled to a power supply node (which may be "ground"), and the source node of transistor 150 is coupled to provide the output voltage $V_{REF}$ on node 152. In some embodiments, source follower transistor 150 is operated in the sub-threshold region where the transconductance ($g_m$) of the transistor is proportional to the drain current. This operation is in contrast to operation in the inversion saturation region where $g_m$ is proportional to the square-root of the drain current. In other words, in the sub-threshold region of operation, the value of $g_m$ is higher for a given drain current. The output impedance of the source follower stage is equal to $1/g_m$ of transistor 150, and may be adjusted by choosing the size of source follower transistor 150 and the drain current provided by current source 140.

Current source 130 provides a current $I_{VT}$ substantially equal to the threshold voltage current of flash cell 110. The operation of the feedback loop in combination with current sourced by current source 130 forces the gate-to-source voltage of flash cell 110 to be substantially $V_T$, which may vary based on how flash cell 110 has been programmed. The output voltage $V_{REF}$ is provided by the voltage on gate node 116, which is substantially equal to $V_T$. By programming flash cell 110 to have a different $V_T$, $V_{REF}$ may be modified.

In some embodiments, flash cell 110 is programmed to perform offset voltage correction. Voltage offsets of the various circuit components may be trimmed out of the circuit by modifying the threshold voltage of flash cell 110 until the desired output voltage is obtained.

In some embodiments, flash cell 110 is manufactured with dimensions larger than the minimum dimensions available in a particular manufacturing process. For example; the width of the gate area, the length of the gate area, or both, may be larger than the minimum dimension available. In some embodiments, the gate area of flash cell 110 is a few times larger than the minimum area possible. In other embodiments, the gate area of flash cell 110 is over one hundred times larger than the minimum area possible. In still further embodiments, the gate area of flash cell 110 is over one thousand times larger than the minimum gate area. A larger gate area may provide greater $V_T$ stability over time, in part because a larger amount of charge may be stored on a larger floating gate within flash cell 110.

Figure 2:
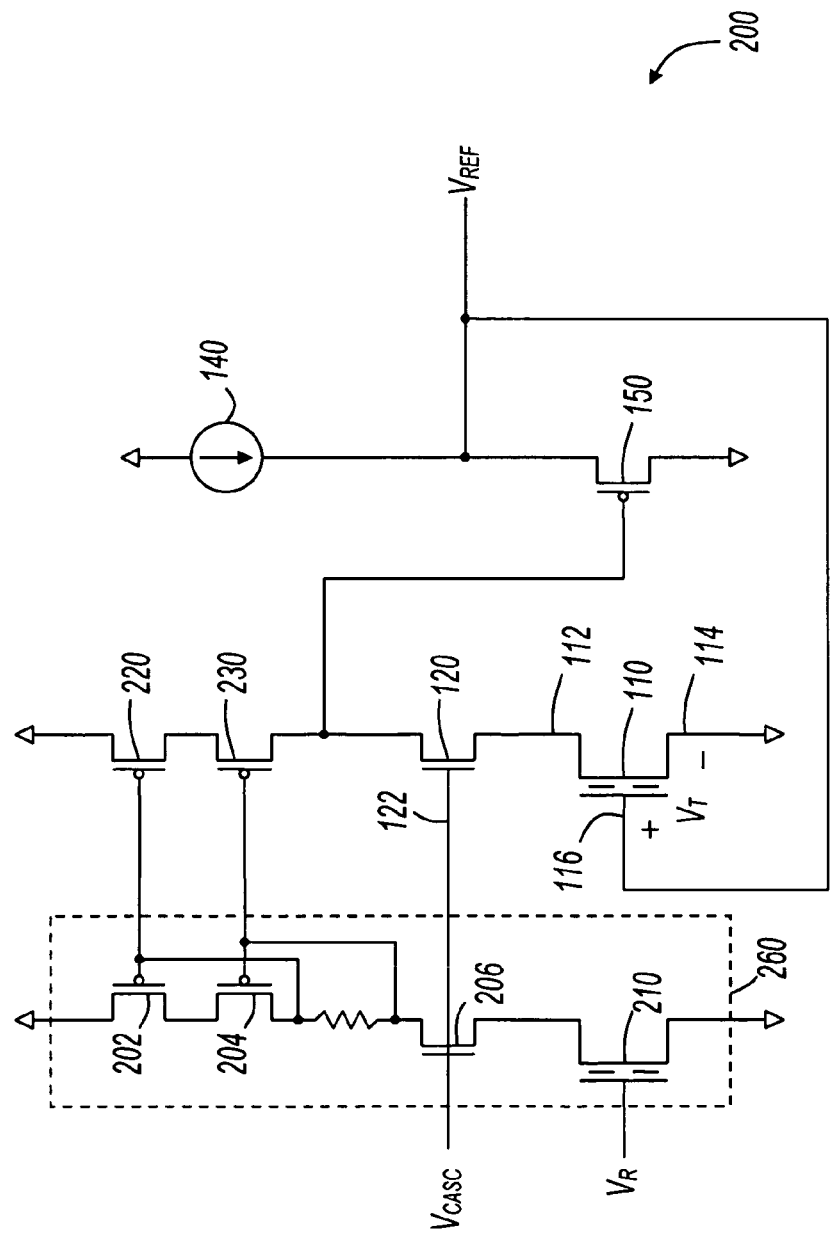
FIG. 2 shows a voltage reference circuit with a current source.

FIG. 2 shows a voltage reference circuit with a current source. Voltage reference circuit 200 includes flash cell 110, transistors 120 and 150, and current source 140, all of which are described above with reference to FIG. 1. Voltage reference circuit 200 also includes reference current generator 260 to provide a reference for the flash cell amplifier stage. Reference current generator 260 includes flash cell 210, cascode transistor 206, and load transistors 202 and 204. Reference current generator 260 generates a reference current using flash cell 210 having a gate driven with reference voltage $V_R$. In some embodiments, flash cell 210 is programmed to have a threshold voltage substantially equal to the reference voltage driving its gate. For example, flash cell 210 may be programmed to have a threshold voltage of $V_R$. As shown in FIG. 2, flash cell 210 driven by $V_R$ provides the reference current for the flash cell amplifier stage that includes flash cell 110. Reference voltage generator 200 also includes transistors 220 and 230, which mirror the reference current in transistors 202 and 204 in reference current generator 260.

Figure 3:
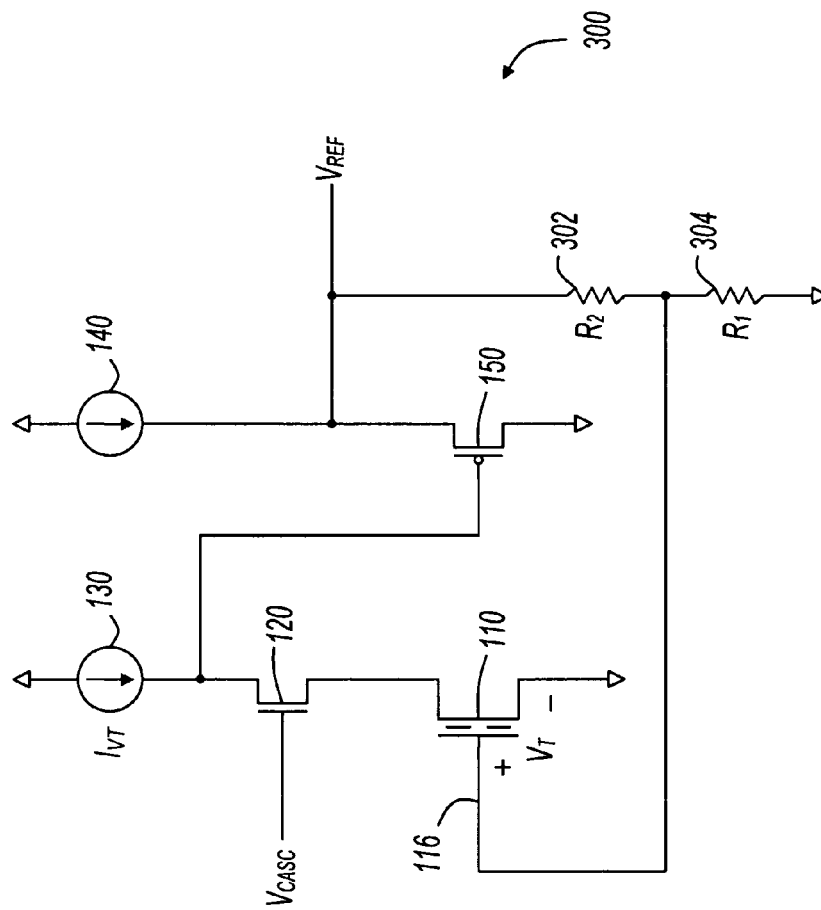
FIG. 3 shows a voltage reference circuit with a voltage divider in a feedback loop.

FIG. 3 shows a voltage reference circuit with a voltage divider in a feedback loop. Voltage reference circuit 300 includes flash cell 110, transistors 120 and 150, and current sources 130 and 140, all of which are described above with reference to FIG. 1. Voltage reference circuit 300 also includes resistors 302 and 304 having resistance values of $R_2$ and $R_1$, respectively. Resistors 302 and 304 form a resistive voltage divider in the feedback path between the output voltage $V_{REF}$ and the voltage $V_T$ on gate 116 of flash cell 110.

In embodiments represented by FIG. 3, $V_{REF}$ is equal to $V_T[(R_2+R_1)/R_1]$. The values of $R_2$ and $R_1$ may be chosen to scale $V_{REF}$ in any manner. In some embodiments, $R_2$ and $R_1$ are manufactured as on-chip resistors, such as diffusion, poly, or metal resistors, and the final output voltage is adjusted by trimming the programmed value of flash cell 110. Although a resistive voltage divider is shown in FIG. 3, this is not a limitation of the present invention. For example, in some embodiments, a capacitive voltage divider may be utilized. Also for example, a transistor-based divider may be used.

Figure 4:
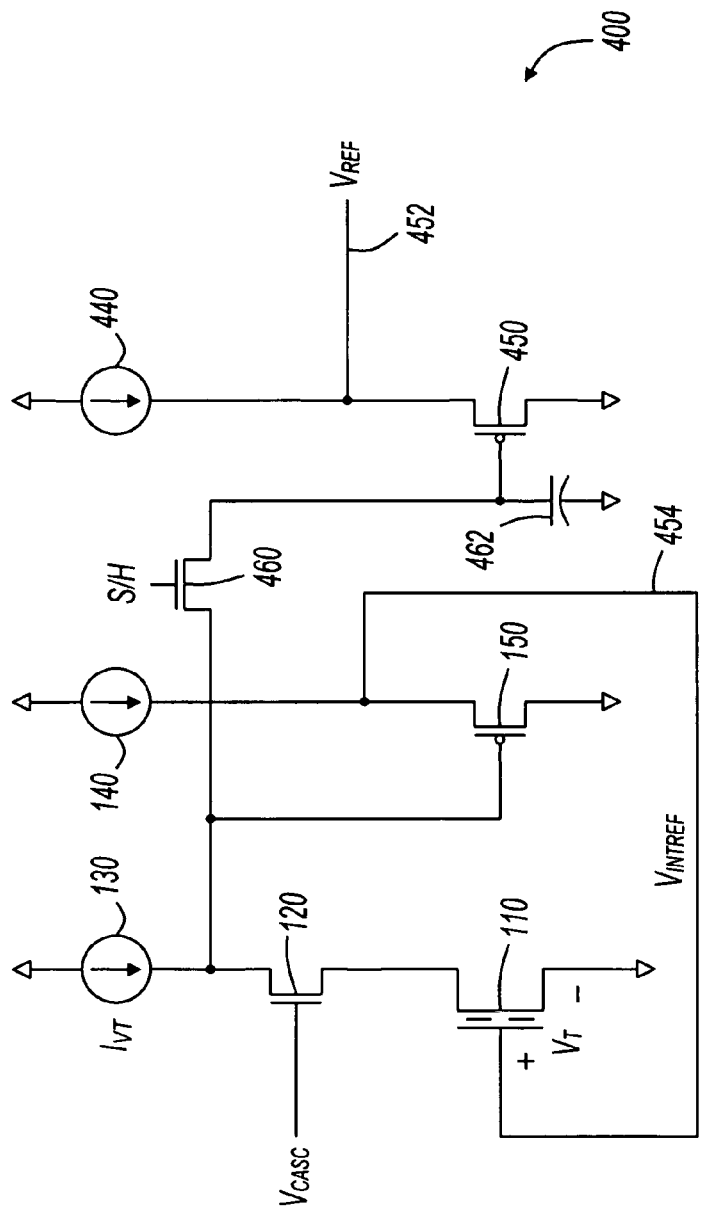
FIGS. 4 and 5 show voltage reference circuits with open loop output circuits.

FIG. 4 shows a voltage reference circuit with an open loop output circuit. Voltage reference circuit 400 includes flash cell 10, transistors 120 and 150, and current sources 130 and 140, all of which are described above with reference to FIG. 1. Voltage reference circuit 400 also includes a sample and hold circuit that includes transistor 460 and capacitor 462, and voltage reference circuit 400 also includes transistor 450 coupled in a source follower arrangement with current source 440 providing a source-to-drain current for transistor 450. Current source 440 and transistor 450 form a third stage coupled to provide an open loop output response. The gate node of transistor 450 is coupled to the gate node of transistor 150 through transistor 460. The drain node of transistor 450 is coupled to a power supply node (which may be "ground"), and the source of transistor 450 is coupled to provide the reference voltage $V_{REF}$ on node 452 at the junction between current source 440 and transistor 450.

P-channel source-followers may be advantageously used to pull down the output node much faster than an n-channel source follower when the initial voltage is higher than the nominal voltage. With the gate voltage fixed, the initial source-to-gate voltage of the source follower transistor will be higher than its nominal value and it can pull down the output voltage very strongly to the nominal value.

In some embodiments, current sources 140 and 440 are designed to source the same current value. Also in some embodiments, transistors 150 and 450 are matched devices that exhibit substantially the same operating characteristics. In embodiments represented by FIG. 4, transistors 150 and 450 are driven by a common gate voltage. In these embodiments, if transistors 150 and 450 are matched, and the two load currents provided by current sources 140 and 440 are matched, the output voltage $V_{REF}$ will be substantially equal to internal loop voltage $V_{INTREF}$ on node 454, which is in turn substantially equal to the threshold voltage $V_T$ of flash cell 110. With the gate voltage of transistor 450 held fixed by the closed loop configuration, transistor 450 may respond very fast and may be able to pull down any voltage on output node 452 to the $V_{REF}$ voltage value without disrupting the operation of the feedback loop.

As shown in FIG. 4, a sample and hold circuit is coupled between the gate node of transistor 150 and the gate node of transistor 450. The sample and hold circuit includes transistor 460 and capacitor 462. Transistor 460 is turned on and off by the operation of the signal "S/H." When transistor 460 is on, capacitor 462 is charged to a static voltage, and the operation of voltage reference circuit 400 is as described above. When transistor 460 is turned off, the voltage on the gate of transistor 450 is sampled and held, and the output response remains unchanged for as long as the voltage on capacitor 462 remains unchanged. In some embodiments, when transistor 460 is off, current sources 130 and 140 may be turned off to save power, while providing a substantially constant output voltage $V_{REF}$. The sample and hold circuit may operate with regular frequency depending on the leakage tolerance of the circuit node that includes the gate of transistor 450. In some embodiments, the sample and hold circuit is omitted.

In some embodiments, $V_{REF}$ on node 452 may be a voltage that is different from the threshold voltage of flash cell 110. For example, a voltage divider may be included in the feedback path as shown in FIG. 3. Further, transistors 150 and 450 may be unmatched, or current sources 140 and 440 maybe unmatched, or both. By intentionally mismatching current sources or transistors, $V_{REF}$ may be a voltage offset from $V_T$.

Figure 5:
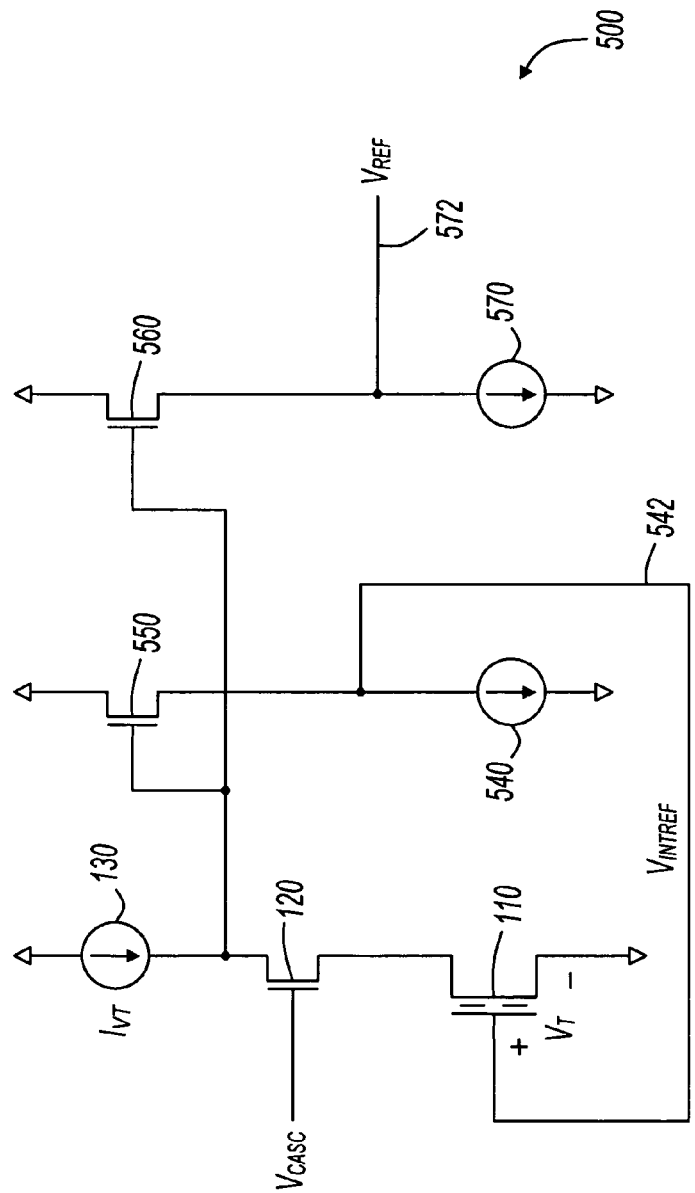

FIG. 5 shows a voltage reference circuit with an open loop output circuit. Voltage reference circuit 500 includes flash cell 110, transistor 120, and current source 130, which are all described above with reference to FIG. 1. As described above, flash cell 110, transistor 120, and current source 130 together form an amplifier stage. Voltage reference circuit 500 also includes transistor 550 coupled in a source follower arrangement with current source 540 providing a drain-to-source current for transistor 550. The source follower circuit of transistor 550 and current source 540 are coupled to the first amplifier stage in a unity gain feedback configuration. In some embodiments, source follower transistor 550 is operated in the sub-threshold region.

Current source 570 and transistor 560 form a third stage coupled to provide an open loop output response. The gate node of transistor 560 is coupled to the gate node of transistor 550. The drain node of transistor 560 is coupled to a power supply node, and the source of transistor 560 is coupled to provide the reference voltage $V_{REF}$ on node 572 at the junction between current source 570 and transistor 560. In some embodiments, transistors 550 and 560 are matched and the two load currents provided by current sources 540 and 570 are matched, and the output voltage $V_{REF}$ will be substantially equal to internal loop voltage $V_{INTREF}$ on node 542, which is in turn substantially equal to the threshold voltage $V_T$ of flash cell 110. With the gate voltage of transistor 560 held fixed by the closed loop configuration, transistor 560 may respond very fast and may be able to pull up any voltage on output node 572 to the $V_{REF}$ voltage value without disrupting the operation of the feedback loop.

The operation of voltage reference circuit 500 is similar to the operation of voltage reference circuit 400 except that transistors 550 and 560 of the source follower circuits are n-channel devices rather than p-channel devices and the sample and hold circuit is omitted. N-channel source-followers may be advantageously used to pull up the output node much faster when the initial voltage is lower than the nominal voltage. With the gate voltage fixed, the initial gate-to-source voltage of the source follower transistor will be higher than its nominal value and it can pull up the output voltage very strongly to the nominal value.

The embodiments represented by FIG. 5 may be combined with embodiments represented by other figures without departing from the scope of the present invention. For example, voltage reference circuit 500 may include a voltage divider in the feedback path, may include a sample and hold circuit, or may not include a third stage. Also for example, a voltage reference circuit with an n-channel source follower output circuit may be combined with a voltage reference circuit with a p-channel source follower output circuit to form a power supply.

Figure 6:
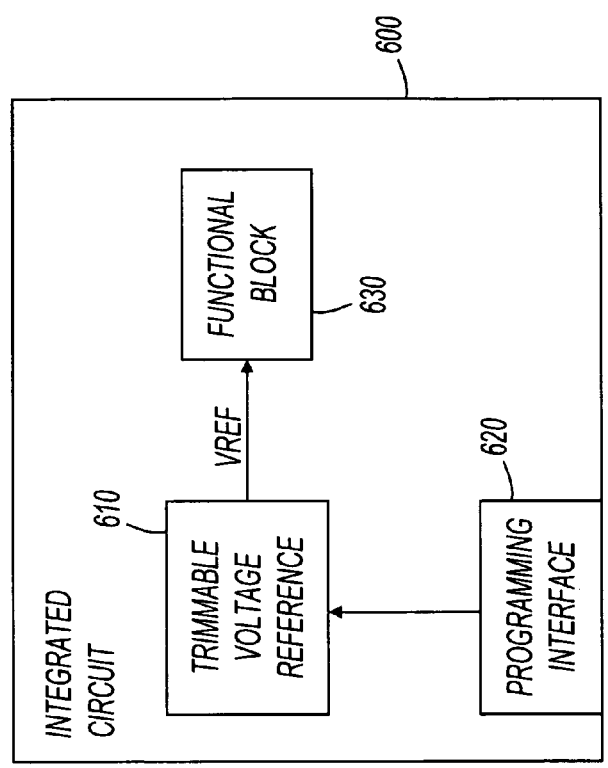
FIG. 6 shows an integrated circuit.

FIG. 6 shows an integrated circuit. Integrated circuit 600 includes trimmable voltage reference 610, programming interface 620, and functional block 630. Trimmable voltage reference 610 may include any voltage reference circuit embodiment described herein, including those shown in FIGS. 1–5.

Programming interface 620 includes circuitry to program a flash cell within trimmable voltage reference 610. By programming one or more flash cells within trimmable voltage reference 610, the output voltage $V_{REF}$ may be "trimmed" to be any value. In some embodiments, programming interface 620 is visible to a user of integrated circuit 600 after being packaged. For example, programming interface 620 may be accessible through pins on the package. In these embodiments, an end user may change $V_{REF}$ by programming one or more flash cells within trimmable voltage reference circuit 610. In other embodiments, the operation of programming interface 620 is reserved for the manufacturer or tester, and is kept from the end user. For example, a manufacturer may set $V_{REF}$ before or after packaging integrated circuit 600, but then disable programming interface 610 or otherwise make it inaccessible to an end user.

Functional block 630 may be any type of functional block that may be included in an integrated circuit. For example, functional block 630 may be a processor circuit, a memory circuit, a digital-to-analog converter, an analog-to-digital converter, or the like. In some embodiments, multiple functional blocks receive $V_{REF}$, and in other embodiments, integrated circuit 600 may include multiple trimmable voltage references and multiple functional blocks.

In some embodiments, functional block 630 includes a flash memory device, and trimmable voltage reference 610 may be coupled to provide a wordline voltage during a write or a read of the flash memory device. Further, in some embodiments, trimmable voltage reference 610 may be coupled to provide a reference for use by sensing circuits when performing a read or verify operation of the flash memory device.

Integrated circuit 600 may be a packaged integrated circuit or an unpackaged integrated circuit die. For example, integrated circuit 600 may be a packaged integrated circuit that includes an interface to allow it to be used as part of an electronic system. Also for example, integrated circuit 600 may be included in a packaged integrated circuit that also includes other components, functional blocks, integrated circuit dice, or subsystems. Further, in some embodiments, integrated circuit 600 may be sold as an unpackaged integrated circuit die.

Figure 7:
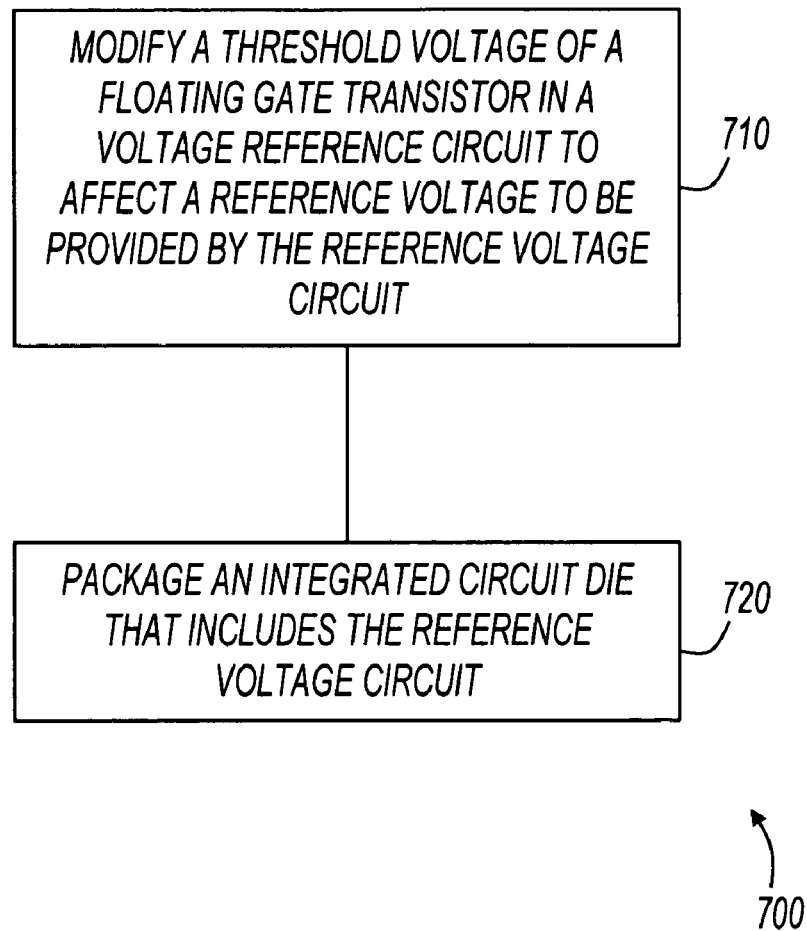
FIG. 7 shows a flowchart in accordance with various embodiments of the present invention.

FIG. 7 shows a flowchart in accordance with various embodiments of the present invention. In some embodiments, method 700, or portions thereof, is performed by a manufacturer of a trimmable voltage reference circuit, or by an automated testing machine capable of testing integrated circuits before or after they are packaged. In other embodiments, method 700 is performed by a control circuit, an integrated circuit, or an electronic system. Method 700 is not limited by the particular type of apparatus or software performing the method. The various actions in method 700 may be performed in the order presented, or may be performed in a different order. Further, in some embodiments, some actions listed in FIG. 7 are omitted from method 700.

Method 700 is shown beginning with block 710 in which a threshold voltage of a floating gate transistor is modified. The floating gate transistor is part of a voltage reference circuit, and modifying the threshold voltage of the floating gate transistor affects a reference voltage to be provided by the reference voltage circuit. In some embodiments, the acts of block 710 correspond to programming flash cell 110 or flash cell 210, shown in the previous figures. Also in some embodiments, the acts of block 710 may correspond to utilizing a programming interface in an integrated circuit such as programming interface 620 in integrated circuit 600 (FIG. 6).

The acts of block 710 may be performed by an integrated circuit manufacturer during wafer level test, or may be performed by a manufacturer after wafer level test. Further, the acts of block 710 may be performed by a systems integrator or an end user. In some embodiments, the manufacturer may prevent any subsequent user from performing the acts of block 710.

At 720, the integrated circuit die that includes the reference voltage circuit is packaged. In some embodiments, this may correspond to the integrated circuit manufacturer packaging the integrated circuit die after performing the acts of block 710. In other embodiments, this may correspond to the integrated circuit manufacturer packaging the integrated circuit die before performing the acts of block 710.

In some embodiments, the actions of method 700 may be performed by a person or an entity other than the integrated circuit manufacturer. For example, an integrated circuit die that includes a trimmable voltage reference may be sold to a party that will program the voltage reference and then package it, or package it and then program it.

Figure 8:
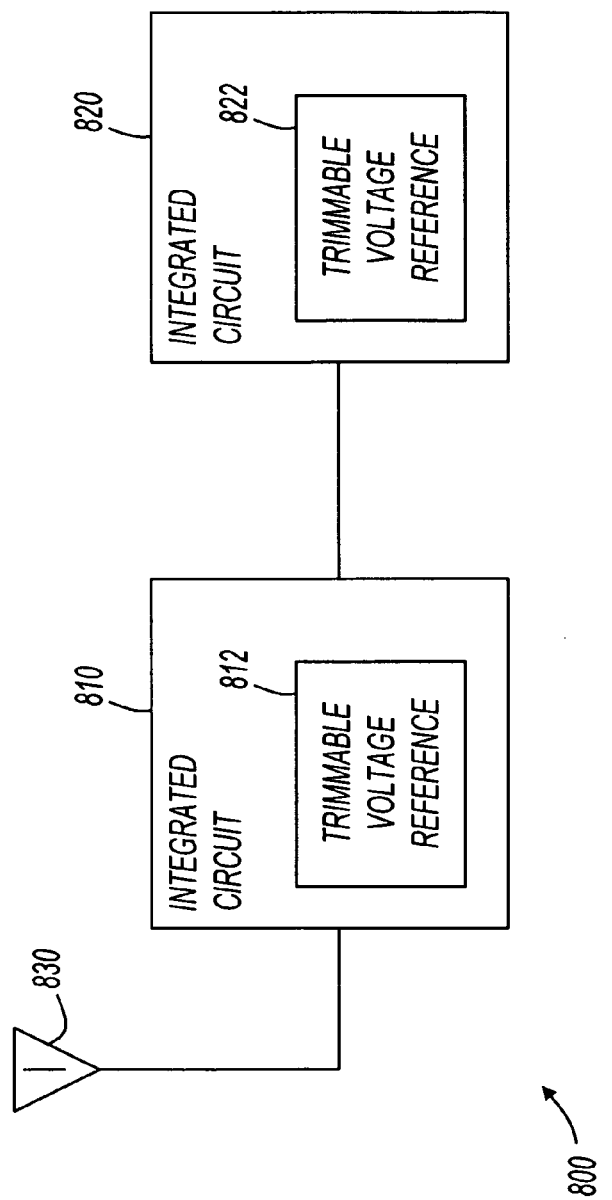
FIG. 8 shows a system diagram in accordance with various embodiments of the present invention.

FIG. 8 shows a system diagram in accordance with various embodiments of the present invention. FIG. 8 shows system 800 including integrated circuits 810 and 820, and antenna 830. In operation, system 800 receives a signal using antenna 830, and the signal is processed by the various elements shown in FIG. 8. Antenna 830 may be a directional antenna or an omni-directional antenna. As used herein, the term omni-directional antenna refers to any antenna having a substantially uniform pattern in at least one plane. For example, in some embodiments, antenna 830 may be an omni-directional antenna such as a dipole antenna, or a quarter wave antenna. Also for example, in some embodiments, antenna 830 may be a directional antenna such as a parabolic dish antenna or a Yagi antenna. In some embodiments, antenna 830 may include multiple physical antennas.

Integrated circuit 810 includes trimmable voltage reference 812, and integrated circuit 820 includes trimmable voltage reference 822. Trimmable voltage references 812 and 822 may be any of the voltage reference circuit embodiments described herein, including those shown in FIGS. 1-5. Integrated circuit 810 may also include a radio frequency (RF) receiver, transmitter, or transceiver coupled to antenna 830. For example, in some embodiments, an RF receiver receives a signal from antenna 830 and performs "front end" processing such as low noise amplification (LNA), filtering, frequency conversion or the like. Trimmable voltage reference 812 may provide a reference to any functional block within integrated circuit 810.

Integrated circuits 810 and 820 may be any type of integrated circuit capable of including trimmable voltage references as shown. For example, either of integrated circuits 810 or 820 may be a processor such as a microprocessor, a digital signal processor, a microcontroller, or the like. Integrated circuits 810 and 820 may also be an integrated circuit other than a processor such as an application-specific integrated circuit (ASIC), a communications device, a memory controller, or a memory such as a flash memory. For ease of illustration, portions of integrated circuits 810 and 820 are not shown. Integrated circuits 810 and 820 may include much more circuitry than illustrated in FIG. 8 without departing from the scope of the present invention.

In some embodiments, integrated circuits 810 and 820 may be separately packaged and mounted on a common circuit board. Each of integrated circuits 810 and 820 may also be separately packaged and mounted on separate circuit boards interconnected by conductors between the circuit boards. In other embodiments, integrated circuits 810 and 820 are separate integrated circuit dice packaged together, such as in a multi-chip module, and in still further embodiments, integrated circuits 810 and 820 are on the same integrated circuit die.

Systems represented by the various foregoing figures can be of any type. Examples of represented systems include computers (e.g., desktops, laptops, handhelds, servers, tablets, web appliances, routers, etc.), wireless communications devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Voltage references, flash cells, feedback circuits, and other embodiments of the present invention can be implemented in many ways. In some embodiments, they are implemented in integrated circuits. In some embodiments, design descriptions of the various embodiments of the present invention are included in libraries that enable designers to include them in custom or semi-custom designs. For example, any of the disclosed embodiments can be implemented in a synthesizable hardware design language, such as VHDL or Verilog, and distributed to designers for inclusion in standard cell designs, gate arrays, or the like. Likewise, any embodiment of the present invention can also be represented as a hard macro targeted to a specific manufacturing process. For example, flash cell 110 (FIGS. 1–5) can be represented as polygons assigned to layers of an integrated circuit.

Although the present invention has been described in conjunction with certain embodiments, it is to be understood that modifications and variations may be resorted to without departing from the spirit and scope of the invention as those skilled in the art readily understand. Such modifications and variations are considered to be within the scope of the invention and the appended claims.

What is claimed is:

1. A voltage reference circuit comprising:
   a first stage including a flash cell and a current source to provide a current substantially equal to a threshold voltage current of the flash cell, wherein the current source includes a second flash cell;
   a second stage coupled in a feedback arrangement with the first stage to provide a reference voltage that varies with a threshold voltage of the flash cell; and
   an open loop output circuit to provide a fast response.

2. The voltage reference circuit of claim 1 wherein the second stage includes a source follower circuit.

3. The voltage reference circuit of claim 2 wherein the source follower circuit includes an isolated gate transistor, and the second stage further includes a current source to bias the isolated gate transistor.

4. The voltage reference circuit of claim 3 wherein the isolated gate transistor comprises a PMOSFET.

5. The voltage reference circuit of claim 3 wherein the isolated gate transistor comprises an NMOSFET.

6. The voltage reference circuit of claim 1 wherein the second flash cell is coupled to receive a gate-to-source voltage substantially equal to a threshold voltage of the second flash cell.

7. The voltage reference circuit of claim 6 wherein the first stage further includes a cascode transistor coupled between the current source and the flash cell.

8. The voltage reference circuit of claim 7 wherein the current source includes a cascode transistor coupled to the second flash cell.

9. The voltage reference circuit of claim 1 wherein the second stage and output circuit include matched source follower circuits and current sources to produce an output voltage related to the threshold voltage.

10. The voltage reference circuit of claim 1 further comprising a sample and hold circuit between the first stage and output circuit.

11. The voltage reference circuit of claim 1 wherein the flash cell includes a gate area that is substantially larger than a minimum realizable gate area associated with a manufacturing process with which the voltage reference circuit is fabricated.

12. The voltage reference circuit of claim 11 wherein the gate area is at least 100 times larger than the minimum realizable gate area.

13. The voltage reference circuit of claim 11 wherein the gate area is at least 1000 times larger than the minimum realizable gate area.

14. A circuit comprising:
   a floating gate transistor having a programmable threshold voltage;
   a feedback circuit to produce a reference voltage that depends on the programmable threshold voltage; and
   an open loop output circuit to provide a fast response.

15. The circuit of claim 14 further comprising a current source to provide a threshold voltage current to the floating gate transistor.

16. The circuit of claim 14 wherein the feedback circuit comprises a source follower circuit.

17. The circuit of claim 16 wherein the source follower circuit comprises an isolated gate transistor having:
   a gate node coupled to receive a voltage influenced by the floating gate transistor;
   a drain node coupled to a power supply node; and
   a source node coupled to a gate node of the floating gate transistor.

18. The circuit of claim 17 wherein the open loop output circuit includes a source follower circuit having an isolated gate transistor comprising:
   a gate node coupled to the gate node of the isolated gate transistor of the feedback circuit;
   a drain node coupled to the power supply node; and
   a source node coupled to provide a reference voltage as an output signal.

19. The circuit of claim 14 further comprising a sample and hold circuit coupled between the feedback circuit and the open loop output circuit.

20. An electronic system comprising:
   an antenna; and
   an integrated circuit coupled to the antenna, the integrated circuit having a voltage reference circuit including a programmable floating gate transistor and feedback circuit coupled to produce a reference voltage that varies based on how the programmable floating gate transistor is programmed, and further including an open loop output circuit.

21. The electronic system of claim 20 wherein the voltage reference circuit further includes a current source to provide a current to the programmable floating gate transistor.

22. The electronic system of claim 21 wherein the feedback circuit includes a source follower circuit.

23. The electronic system of claim 22 wherein the open loop output circuit includes a source follower circuit having a gate node coupled to a gate node of the source follower circuit of the feedback circuit.

24. A method comprising modifying a threshold voltage of a floating gate transistor in a reference voltage circuit to affect a reference voltage to be provided by the reference voltage circuit.

25. The method of claim 24 further comprising packaging an integrated circuit die that includes the reference voltage circuit.

26. The method of claim 25 wherein the modifying act is performed prior to the packaging act.

27. The method of claim 25 wherein the modifying act is performed after the packaging act.

* * * * *